United States Patent
Evans et al.

(10) Patent No.: US 7,820,987 B2
(45) Date of Patent: Oct. 26, 2010

(54) PREDICTING DOSE REPEATABILITY IN AN ION IMPLANTATION

(75) Inventors: Morgan Evans, Manchester, MA (US); Norman E. Hussey, Middleton, MA (US); Steven R. Walther, Andover, MA (US); Rekha Padmanabhan, Peabody, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 532 days.

(21) Appl. No.: 11/961,157

(22) Filed: Dec. 20, 2007

(65) Prior Publication Data

US 2009/0162953 A1    Jun. 25, 2009

(51) Int. Cl.
*A61N 5/00* (2006.01)
*G21G 5/00* (2006.01)

(52) U.S. Cl. .............. 250/492.21; 250/427; 250/492.3; 250/398; 250/396 R; 438/10; 438/301; 438/303; 315/306

(58) Field of Classification Search .............. 250/492.3, 250/427, 492.21, 398, 396; 438/10, 301, 438/303; 315/306
See application file for complete search history.

(56) References Cited

U.S. PATENT DOCUMENTS

| 6,908,836 | B2 | 6/2005 | Murrell et al. | |
|---|---|---|---|---|
| 2005/0263721 | A1* | 12/2005 | Renau et al. | 250/492.21 |
| 2006/0097196 | A1 | 5/2006 | Graf et al. | |

* cited by examiner

*Primary Examiner*—Jack I Berman
*Assistant Examiner*—Meenakshi S Sahu

(57) ABSTRACT

An approach for predicting dose repeatability in an ion implantation is described. In one embodiment, an ion source is tuned to generate an ion beam with desired beam current. Beam current measurements are obtained from the tuned ion beam. The dose repeatability is predicted for the ion implantation as a function of the beam current measurements.

25 Claims, 4 Drawing Sheets

PREDICTING DOSE REPEATABILITY IN AN ION IMPLANTATION

BACKGROUND

This disclosure relates generally to ion implanters, and more specifically to predicting dose repeatability for an ion implantation of a substrate.

Ion implantation is a standard technique for introducing conductivity-altering impurities into workpieces such as semiconductor wafers (referred to hereinafter as substrates). In a conventional beamline ion implanter, an ion source generates an ion beam and extraction electrodes extract the beam from the source. An analyzer magnet receives the ion beam after extraction and filters selected ion species from the beam. The ion beam passing through the analyzer magnet then enters an electrostatic lens comprising multiple electrodes with defined apertures that allow the ion beam to pass through. By applying different combinations of voltage potentials to the multiple electrodes, the electrostatic lens can manipulate ion energies. A corrector magnet shapes the ion beam generated from the electrostatic lens into the correct form for deposition onto the substrate. A deceleration stage comprising a deceleration lens receives the ion beam from the corrector magnet and further manipulates the energy of the ion beam before it hits the substrate. As the beam hits the substrate, the ions in the beam penetrate the surface of the substrate coming to rest beneath the surface to form a region of desired conductivity.

In semiconductor manufacturing, a beamline ion implanter often has to process many batches of substrates based on various recipes. For batches of substrates processed with a common recipe, it is critical that the ion implanter maintain a consistent ion beam output so that it can deliver a desired dose of ions at the chosen energy and incident angle into the surface of each substrate. Dose repeatability which is a measurement indicative of the ability of an ion implanter to generate a batch of substrates each containing a dose of ions at the chosen energy and incident angle that matches the dose of ions found on the other substrates in the batch. Because the optimal combination of settings for beamline elements (e.g., ion source, extraction electrodes, analyzer magnet, first deceleration stage, corrector magnet, second deceleration stage, etc.) may change from setup to setup due to variations in source conditions or changes in the beamline surface conditions that arise over time, it becomes difficult to obtain an ion implantation for a batch of substrates with a dose repeatability that is satisfactory for the implantation. Consequently, some substrates in the batch may end up having undesired conductivity which can lead to scrapping of the substrates. Currently, there are no approaches that enable ion implanters to predict dose repeatability for ion implantations.

SUMMARY

In a first embodiment, there is a method for predicting dose repeatability for an ion implantation. In this embodiment, the method comprises tuning an ion source to generate an ion beam with desired beam current; obtaining beam current measurements from the tuned ion beam; and predicting the dose repeatability for the ion implantation as a function of the beam current measurements.

In a second embodiment, there is a method for controlling an ion implantation of a substrate according to predicted dose repeatability. In this embodiment, the method comprises tuning an ion source to generate an ion beam suitable for performing the ion implantation of the substrate; obtaining beam current measurements from the tuned ion beam; determining the predicted dose repeatability for the ion implantation as a function of the beam current measurements; and controlling the ion implantation of the substrate as a function of the predicted dose repeatability.

In a third embodiment, there is a system for predicting dose repeatability for an ion implantation of a substrate. In this embodiment, the system comprises a tuner configured to tune an ion source to generate an ion beam suitable for performing the ion implantation of the substrate. A beamline monitor is configured to obtain beam current measurements from the tuned ion beam. A controller is configured to predict the dose repeatability for the ion implantation as a function of the beam current measurements obtained by the beamline monitor.

In a fourth embodiment, there is an ion implanter. In this embodiment, the ion implanter comprises an ion source configured to generate an ion beam. A magnet is configured to bend the path of the ion beam. An end station is configured to receive the ion beam from the magnet for ion implantation of a substrate within the end station. A controller is configured to control the ion implantation of the substrate as a function of predicted dose repeatability, wherein the controller predicts dose repeatability from beam current measurements obtained from the ion beam after tuning of the ion source.

In a fifth embodiment, there is a computer-readable medium storing computer instructions, which when executed by a computer system enables an ion implanter to control an ion implantation of a substrate according to predicted dose repeatability. In this embodiment, the computer instructions comprise: tuning an ion source to generate an ion beam suitable for performing the ion implantation of the substrate; obtaining beam current measurements from the tuned ion beam; predicting the dose repeatability for the ion implantation as a function of the beam current measurements; and controlling the ion implantation of the substrate as a function of the predicted dose repeatability.

DETAILED DESCRIPTION

Figure 1:
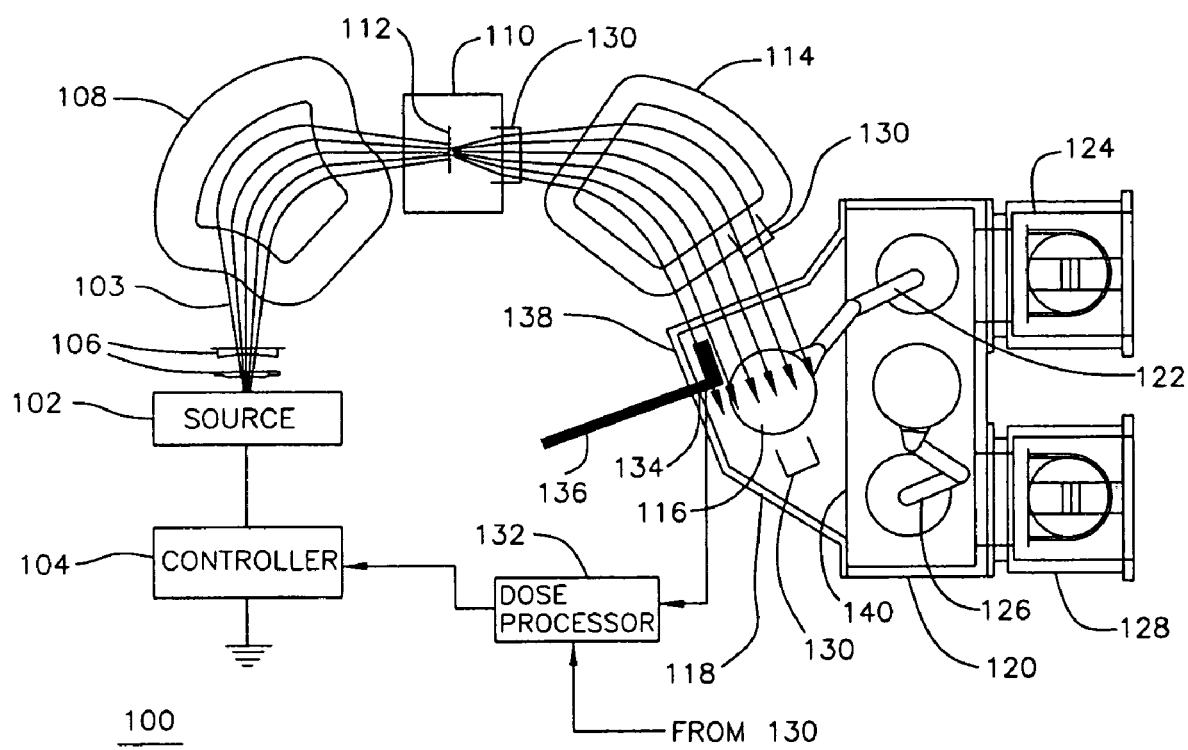
FIG. 1 shows a schematic top view of an ion implanter according to one embodiment of the disclosure.

FIG. 1 shows a schematic top view of an ion implanter 100 according to one embodiment of the disclosure. The ion implanter 100 comprises an ion source 102, such as a plasma source, controlled by a controller 104. The ion source 102 generates a stream of charged particles, known as an ion beam 103. Extraction electrodes 106 receive the ion beam 103 from the ion source 102 and accelerate positively charged ions within the beam leaving the source 102. An analyzer magnet 108, such as a 90° deflection magnet, receives the ion beam 103 after positively charged ions have been extracted from the source 102 and accelerates and filters unwanted species from the beam. In particular, as the ion beam 103 enters the analyzer magnet 108, a magnetic field directs the ion species into circular paths. Heavier ions will have larger radii of curvature and strike the outer wall of the analyzer magnet 108; lighter ions have smaller radii of curvature and will strike the inner wall of the magnet. Only ions having the needed mass-to-charge ratio will pass through the analyzer magnet 108. The ion beam 103 passing through the analyzer magnet 108 then enters an electrostatic lens 110, which includes a mass slit 112 which further removes unwanted ions (ion masses) from the beam and multiple electrodes (not shown) with defined apertures to allow the ion beam to pass therethrough.

A corrector magnet 114, such as a 45° degree corrector magnet, collimates the ion beam 103 generated from the electrostatic lens 110 into the correct form for deposition onto a substrate 116 such as a semiconductor wafer. Although not shown, a deceleration stage comprising a deceleration lens can receive the ion beam 103 from the corrector magnet 114 and further manipulate the energy of the beam before it enters a vacuum chamber 118 and hits the substrate 116.

A substrate handling chamber 120 loads the substrate 116 in the vacuum chamber 118 so that the substrate can undergo the ion implantation operation. The substrate handling chamber 120 uses a transport mechanism 122 such as load lock to remove a substrate from a loading cassette 124 or substrate holder and introduces it to the vacuum chamber 118 for ion implantation. In particular, the transport mechanism 122 places the substrate 116 in the vacuum chamber 118 in the path of the ion beam 103 such that the beam hits the substrate, causing the ions in the beam to penetrate the surface of the substrate and come to rest beneath the surface to form a region of desired conductivity. After completing the processing of the substrate 116, another transport mechanism 126 transports the substrate from the vacuum chamber 118 back to a processed cassette 128 or substrate holder. The vacuum chamber 118, substrate handling chamber 120, transport mechanism 122, loading cassette 124, transport mechanism 126 and substrate holder 128 are collectively referred to hereinafter as an end station. This process of loading, processing, removing and storing substrates continues at the end station until all of the substrates in the loading cassette have undergone the ion implantation operation.

For ease of illustration, FIG. 1 only shows those beamline elements of the ion implanter 100 that facilitate a general understanding of the approach described in the disclosure (i.e., predicting dose repeatability and controlling the ion implantation according to the predicted dose repeatability). Those skilled in the art will recognize that the ion implanter 100 can have additional components not shown in FIG. 1. Furthermore, those skilled in the art will recognize that the approach described herein for predicting the dose repeatability and controlling the ion implantation according to the predicted dose repeatability is suitable for any type of ion implanter such as a high current implanter, a medium current implanter or a high energy implanter. The individual elements may change between these different ion implanters but the approach described herein is still generally applicable. Furthermore, this approach for predicting the dose repeatability and controlling the ion implantation according to the predicted dose repeatability is suitable for spot beams or a ribbon beams.

Because the optimal combination of settings for beamline elements for the ion implanter 100 may change from setup to setup due to variations in source conditions or changes in the beamline surface conditions that arise over time, it becomes necessary to tune the ion implanter 100 in order to deliver desired beam characteristics.

Generally, an ion implanter is tuned to deliver maximum ion beam current which translates into higher machine throughput. Tuning typically begins by finding previously used beamline element settings that will produce a beam output that most closely matches the maximum ion beam current desired by the operator of the implanter. Each of the beamline element settings is then sequentially changed one at a time through different sets of values until a value is found for that beam element that provides a maximum ion beam current. Note that the beamline element settings can be changed in combination and are not limited to making sequential changes. After all of the beam elements have been tuned to deliver maximum ion beam current, beam tuning is deemed to be complete so that the ion implanter can initiate ion implantation operations. Moreover these new settings for the beamline elements are stored for future setups.

Instead of tuning for maximum ion beam current, the approach described herein tunes the ion beam to what is specified to be implanted on the substrate 116. In particular, the approach described herein tunes the ion source 102 for both beam quantity and quality by tuning for a statistically expected implant that projects how good the implant will be in the form of statistical estimates. More specifically, the approach tunes for both beam quantity and quality by first tuning the ion source 102 for desired beam current along the beamline and then using the derived statistical estimates (which are indicative of the predicted dose repeatability) as a metric to examine the beam in the end station under real operating conditions. Tuning for both beam quantity and quality in the beamline and using the derived statistical estimates as a metric to examine the beam in the end station under real operating conditions, results in an approach that enables the ion implanter 100 to be externally focused to attain the desired implant.

In one embodiment, the process of tuning the ion source 102 is facilitated by using a setup cup 130 located in the beamline of the ion implanter 100 as shown in FIG. 1. The setup cup 130 is essentially a Faraday cup that measures the cumulative ion dose in the ion beam 103. In particular, the setup cup 130 receives the ion beam 103 and produces an electrical current in the cup that is representative of ion beam current. The setup cup 130 supplies the electrical current to an electronic dose processor 132, which integrates the current with respect to time to determine the cumulative ion dose. As shown in FIG. 1, the setup cup 130 is located at the end of the electrostatic lens 110, at the end of the corrector magnet 114 and in the end station (i.e., in the vacuum chamber 118 behind where the substrate is loaded). Those skilled in the art will recognize that the location of the setup cup 130 is not limited to the electrostatic lens 110, the corrector magnet 114 and the vacuum chamber 118. In particular, the setup cup 130 can be located about only one of these elements or it may be desirable to place multiple setup cups 130 at other locations along the beamline to monitor beam current at locations that include but are not limited to the electrostatic lens 110, the corrector magnet 114 and the vacuum chamber 118.

In one embodiment of operation, the setup cup 130 receives the ion beam 103 and produces an electrical current in the cup that is representative of ion beam current generated by the ion source 102. The setup cup 130 supplies the electrical current to the electronic dose processor 132, which integrates the current with respect to time to determine the cumulative ion dose. The dose processor 132 supplies the ion dose determination to the controller 104 which ascertains whether the ion beam contains the desired beam current for the implantation of the substrate 116. The controller 104 tunes the ion source 102 until it determines that the predicted dose repeatability for the ion source is suitable for the ion implantation. Below are additional details on how the controller 104 tunes the ion source 102 and determines whether the predicted dose repeatability for the source is suitable for the ion implantation of the substrate 116.

Referring back to FIG. 1, a profiling Faraday cup 134 is attached to a shaft 136 which is driven by a motor (not shown). In operation, the motor drives the profiling Faraday cup 134 through the ion beam directed into the vacuum chamber 118. The ion beam 103 passes through the profiling Faraday cup 134 and produces an electrical current in the cup that is representative of ion beam current. The profiling Faraday cup 134 supplies the electrical current to the electronic dose processor 132, which integrates the current with respect to time to determine the cumulative ion dose. Note that it is also possible for the profiling Faraday cup 134 to be used to perform the function of the setup cup 130.

The dose processor 132 supplies the ion dose determination to the controller 104 which ascertains whether ion beam generated by the ion source 102 will result in a predicted dose repeatability that is suitable for the ion implantation of the substrate 116. If the dose repeatability is not sufficient, then the controller 104 tunes the ion source 102 within the end station for lower beam noise and/or current. Alternatively, if the dose repeatability is sufficient for the ion implantation, then the controller 104 enables the ion source 102 to begin the ion implantation in the end station. Below are additional details on how the controller 104 determines whether the predicted dose repeatability for the source is suitable for the ion implantation of the substrate 116, tunes the ion source 102 into the end station, and controls the ion implantation according to the dose repeatability.

Figure 2:
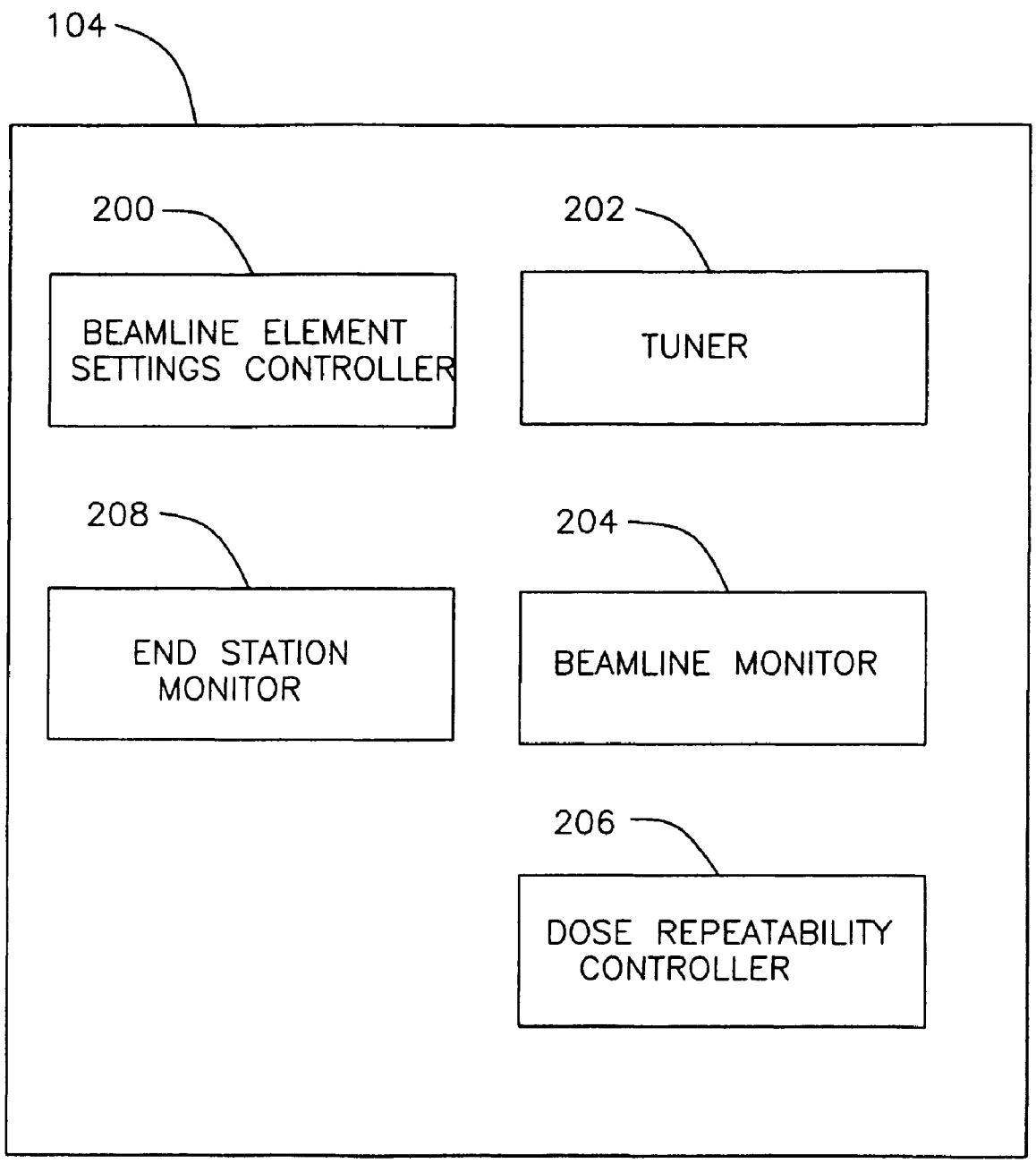
FIG. 2 shows a more detailed view of the controller shown in FIG. 1.

FIG. 2 shows a more detailed view of the controller 104 shown in FIG. 1. As shown in FIG. 2, the controller 104 comprises a beamline element settings controller 200 configured to provide beamline element settings for generating the desired beam current and any other beam properties (e.g., angular distribution, beam density distribution and beam profile uniformity). The beamline settings controller 200 has the capability to interface with the hardware and controls the operation of the hardware settings of the ion implanter 100. In one embodiment, the beamline element settings controller 200 selects initial beamline element settings from a historical database (not shown). The historical database comprises a number of entries that include combinations of settings for the beamline elements as applied in past beam setups. Typically, each entry has been compiled by receiving input data from various sources such as a recipe generator, a beam setup report, and an ion implant report.

A tuner 202 correlates the beamline element settings with beam properties. In particular, the tuner 202 provides the capability to determine the effect that a change to one or more of the initial beamline element settings will have on beam current as well as on any other desired beam properties. As a result, the tuner 202 is configured to predict, calculate or determine and generate tuned beamline element settings from the initial beamline settings that match the desired beam current and any other beam properties. In one embodiment, the tuner 202 is a statistical model.

The beamline element settings controller 200 sets the ion source 102 and beamline elements in accordance with the tuned beamline element settings calculated by the tuner 202. A beam monitor 204 receives signals indicative of the beam current from measurements taken by the setup cup 130. Although not shown, the beam monitor 204 is configured to receive signals indicative of other beam properties from measurements taken by sensors located about the various beamline elements. An illustrative but non-exhaustive listing of sensors could include power system readbacks (i.e., voltage and current), magnetic and electrostatic field monitors, optical sensors, beam angle distribution monitor, plasma potential monitor, beamline health monitor (e.g., quartz crystal microbalance), resistivity sensor, thermocouple, etc.

A dose repeatability controller 206 examines the beam current measurements and predicts dose repeatability from these measurements. In one embodiment, the predicted dose repeatability (PDR) is determined from the following:

$$PDR = \frac{(\text{Sigma} + Tvalue * SigmaRn)}{\sqrt{(TotalPasses * NumberScanLines - 1)}} \quad (1)$$

wherein, Sigma is the relative standard deviation,

Tvalue is the statistical factor relating sample size, N, and confidence level, and SigmaRn is the standard error N measures of current defined as:

$$SigmaRn = \frac{\text{Sigma}}{\sqrt{N}} \quad (2)$$

The dose repeatability controller 206 compares the predicted dose repeatability to a target value that has been determined to be suitable for obtaining the desired implantation. If the dose repeatability controller 206 determines that the predicted dose repeatability is not suitable for obtaining the ion implantation, then the dose repeatability controller 206 notifies the tuner 202 so that the ion source can be tuned again. In one embodiment, if the dose repeatability controller 206 determines that the predicted dose repeatability is greater than the target value, the tuner 202 tunes the ion source 102 into the setup cup 130 to obtain lower beam noise and/or beam current. Once the ion source 102 has been tuned accordingly, the source directs the ion beam into the setup cup 130 and another determination of the predicted dose repeatability is made. Once the dose repeatability controller 206 determines that the predicted dose repeatability is suitable for obtaining the desired implant (e.g., predicted dose repeatability is less than the target value), then another determination of the predicted dose repeatability is made; but this time it is ascertained from the end station.

In order to obtain beam current measurements from the end station, the setup cup 130 is not engaged (except for the one located in the vacuum chamber) so that the ion beam passes into the end station. The profiling Faraday cup 134 moves in and out of the substrate plane within the vacuum chamber 118 without a substrate in the plane. The ion beam 103 passes through the profiling Faraday cup 134 and/or the setup cup 130 located in back of the substrate in the vacuum chamber 118, which then supplies the electrical current to the electronic dose processor 132, which integrates the current with respect to time to determine the cumulative ion dose. As shown in FIG. 2, the controller 104 includes an end station monitor 208 which monitors the beam current measurements from the end station.

The dose repeatability controller 206 examines the beam current measurements monitored by the end station monitor 208 and predicts dose repeatability from these measurements in the same manner described above. In addition, the dose repeatability controller 206 compares the predicted dose repeatability to a target value. If the dose repeatability controller 206 determines that the predicted dose repeatability is not suitable for obtaining the ion implantation, then the dose repeatability controller 206 notifies the tuner 202 so that the ion source can be tuned again. In one embodiment, if the dose repeatability controller 206 determines that the predicted dose repeatability is greater than the target value, the tuner 202 tunes the ion source 102 into the end station to obtain lower beam noise and/or beam current. Once the ion source 102 has been tuned accordingly, the source directs the ion beam into the end station and another determination of the predicted dose repeatability is made. Once the dose repeatability controller 206 determines that the predicted dose repeatability is suitable for obtaining the desired implant (e.g., predicted dose repeatability is less than the target value), then the ion implanter 100 is ready for ion implantation of substrates.

FIG. 2 only shows the components of the controller 104 that facilitate a general understanding of the approach used to predict the dose repeatability and control the ion implantation according to the predicted dose repeatability. Those skilled in the art will recognize that the controller 104 can have additional components not shown in FIG. 1. For example, the controller 104 may have a user interface component that enables an operator to input commands, data and/or to monitor the ion implanter 100 via the controller 104.

In this disclosure, the controller 104 can take the form of an entirely hardware embodiment, an entirely software embodiment or an embodiment containing both hardware and software elements. In a preferred embodiment, the processing functions performed by the controller 104 are implemented in software, which includes but is not limited to firmware, resident software, microcode, etc.

Furthermore, the processing functions performed by the controller 104 can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the computer, instruction execution system, apparatus, or device. The computer readable medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include a compact disk—read only memory (CD-ROM), a compact disk—read/write (CD-R/W) and a digital video disc (DVD).

Figure 3:
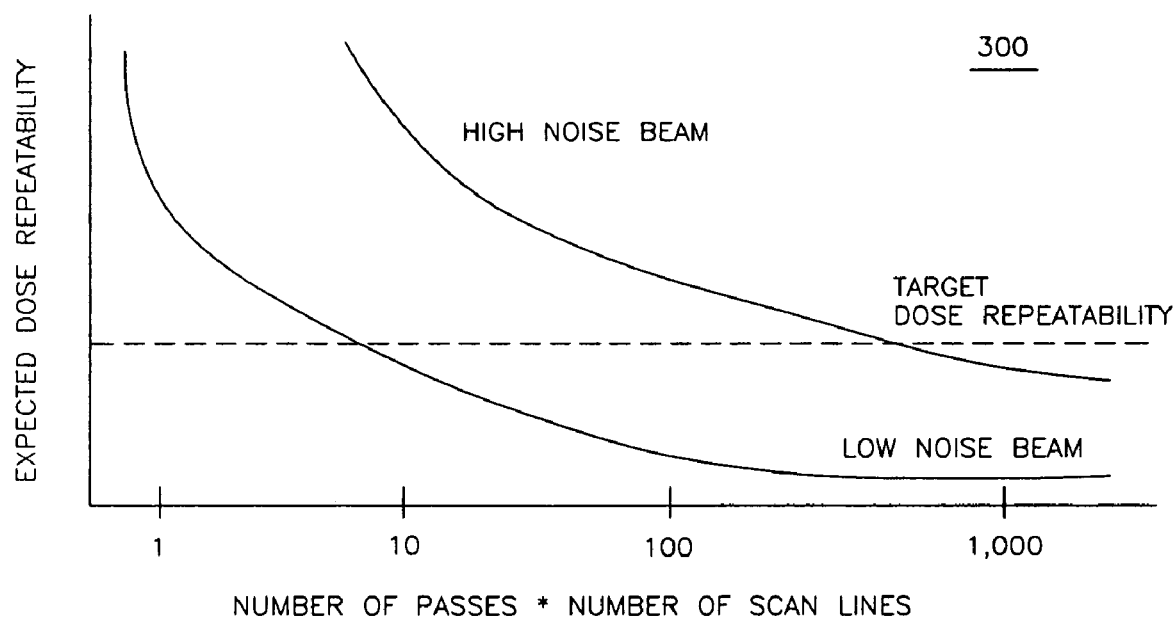
FIG. 3 shows a graphical representation illustrating the relationship between expected dose repeatability and beam noise for an ion implantation.

FIG. 3 shows a graphical representation 300 illustrating the relationship between expected dose repeatability and beam noise that occurs in an ion implantation. In particular, FIG. 3 shows that the expected or predicted dose repeatability for an ion implantation of a substrate improves as the number of passes (i.e., the number of times that a substrate is cycled vertically) through the ion beam. Note that the closer the predicted dose repeatability is to zero, the better the ion implantation will be. FIG. 3 shows that as the number of passes that the substrate is cycled through increases, the beam noise moves from high noise to low noise eventually becoming less than the target dose repeatability which is shown in FIG. 3 as a dashed line. Once the predicted dose repeatability becomes less than the target dose repeatability, then as mentioned above, this is an indication that the ion implanter 100 will produce an implantation that is in conformance with desired parameters.

Figure 4:
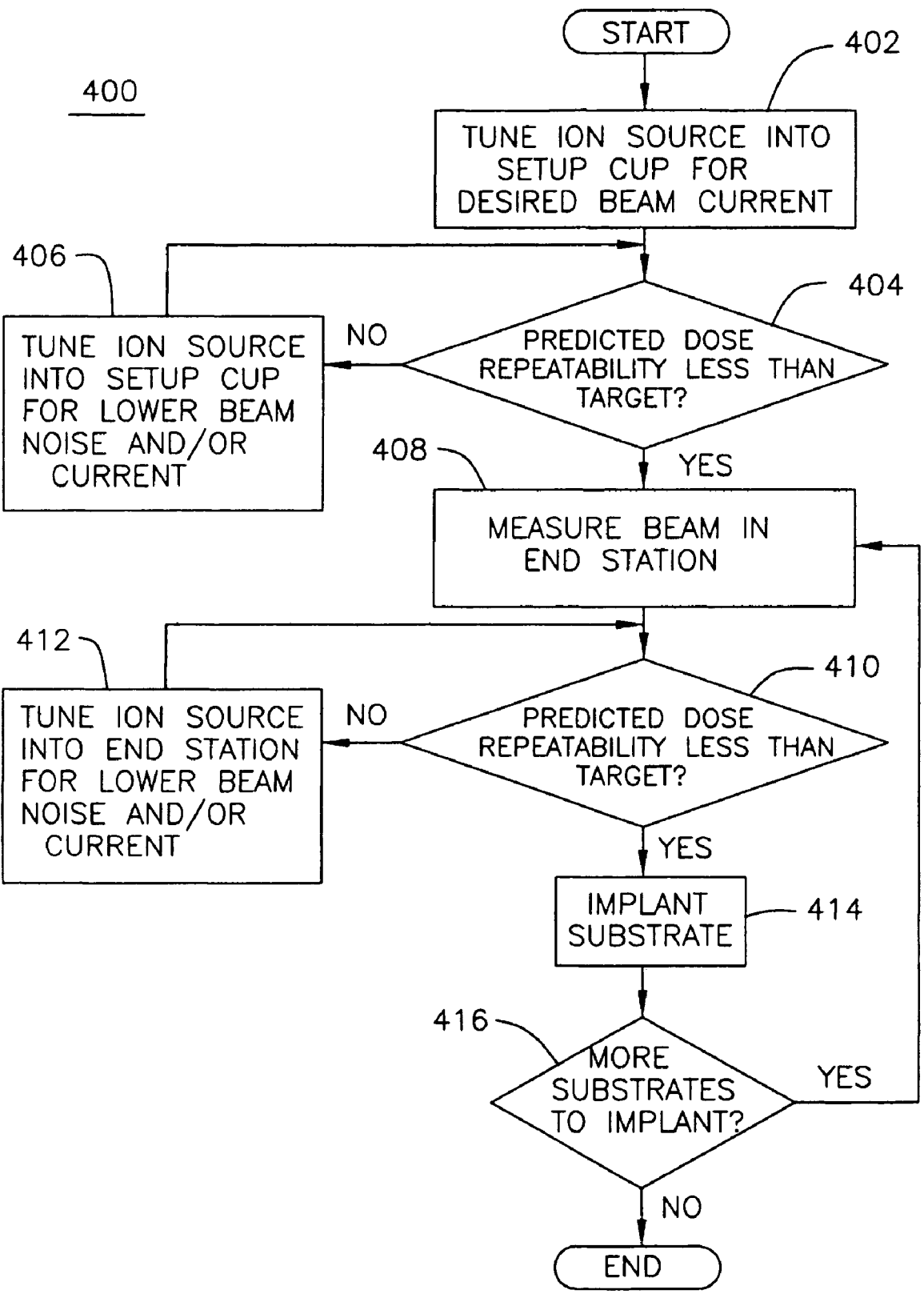
FIG. 4 shows a flow chart describing a process for predicting the dose repeatability for an ion implantation performed for the ion implanter of FIG. 1 according to one embodiment of this disclosure.

FIG. 4 shows a flow chart describing the process 400 for predicting the dose repeatability for an ion implantation performed for the ion implanter 100 of FIG. 1 according to one embodiment of this disclosure. As shown in FIG. 4, the process 400 begins at 402 where the tuner 202 tunes the ion source 102 in the setup cup 130 to generate an ion beam that has the desired beam current necessary to achieve the ion implantation. The beamline monitor 204 obtains the beam current measurements and supplies them to the dose repeatability controller 206 which predicts dose repeatability at 404. In particular, the dose repeatability controller 206 uses equations 1 and 2 described above to ascertain the predicted dose repeatability from the ion beam measurements.

If the dose repeatability controller determines that the predicted dose repeatability is greater than a target dose repeatability for the ion implantation, then tuner 202 retunes the ion source 102 at 406. In particular, the tuner 202 tunes the ion source 102 into the setup cup 130 to obtain lower beam noise and or beam current. Once the ion source 102 has been tuned accordingly, the source directs the ion beam into the setup cup 130 and another determination of the predicted dose repeatability is made at 404. The tuning of the ion source 102 continues until it has been determined that the predicted dose repeatability is less than the target value desired for the ion implantation.

Once the dose repeatability controller 206 determines that the predicted dose repeatability is less than the target value, then the ion beam is passed onto the end station. The end station monitor 208 receives current measurements from the profiling faraday cup 134 and/or setup cup 130 located in the vacuum chamber behind the substrate at 408. The end station supplies the beam current measurements from the end station to the dose repeatability controller 206 which predicts dose repeatability from these measurements in the same manner described above at 410.

If the dose repeatability controller 206 determines that the predicted dose repeatability is greater than a target dose repeatability for the ion implantation, then tuner 202 retunes the ion source 102 at 412. In particular, the tuner 202 tunes the ion source 102 into the end station to obtain lower beam noise and/or beam current. Once the ion source 102 has been tuned accordingly, the source directs the ion beam into the end station and another determination of the predicted dose repeatability is made at 410. The tuning of the ion source 102 continues until it has been determined that the predicted dose repeatability is less than the target value desired for the ion implantation.

Once the dose repeatability controller 206 determines at 410 that the predicted dose repeatability is suitable for obtaining the desired implant (e.g., predicted dose repeatability is less than the target value), then the ion implanter 100 is ready for ion implantation of substrates. In particular, the ion implanter 100 begins the ion implantation of a substrate 116 at 414. Once the substrate has been implanted a determination is made at 416 to ascertain whether there are more substrates to implant. If there are more substrates to implant, then process acts 408-416 are reiterated until it is determined at 416 that there are no more substrates to implant.

The foregoing flow chart shows some of the processing functions associated with predicting dose repeatability. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added. For example, additional blocks could be added to show that the predicted dose repeatability value could be used in to provide further control of the ion implantation. In particular, another type of Faraday cup such as a closed loop Faraday cup can be used to obtain beam current measurements while implanting substrates. The dose repeatability controller 206 could then predict the dose repeatability for the implantation of the substrate and compare it to the target dose repeatability. If the predicted dose repeatability is greater than the target dose repeatability, then the controller could have the ion source 102 and the beamline elements tuned during the implantation to ensure that the desired implantation of the substrate is attained.

It is apparent that there has been provided with this disclosure an approach that predicts dose repeatability in an ion implantation. While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A method for predicting dose repeatability for an ion implantation, comprising:
    tuning an ion source to generate a tuned ion beam with desired beam current;
    obtaining beam current measurements from the tuned ion beam; and
    predicting the dose repeatability for the ion implantation as a function of the beam current measurements using at least a standard deviation, an average, and a sample size of the beam current measurements.

2. The method according to claim 1, wherein the obtaining beam current measurements includes taking measurements along the beamline.

3. The method according to claim 1, further comprising determining whether the predicted dose repeatability is less than a target dose repeatability for the ion implantation.

4. The method according to claim 3, further comprising tuning the ion source to generate an ion beam with desired beam noise and/or beam current if the predicted dose repeatability is greater than the target dose repeatability for the ion implantation.

5. The method according to claim 3, further comprising directing the ion beam into an end station that is configured to receive a substrate during the ion implantation if the predicted dose repeatability is less than the target dose repeatability for the ion implantation.

6. The method according to claim 5, further comprising obtaining beam current measurements from the end station.

7. The method according to claim 6, further comprising predicting the dose repeatability for the ion implantation as a function of the beam current measurements obtained from the end station.

8. The method according to claim 7, further comprising determining whether the predicted dose repeatability is less than the target dose repeatability for the ion implantation.

9. The method according to claim 8, further comprising tuning the ion source to generate an ion beam with desired beam noise and/or beam current if the predicted dose repeatability is greater than the target dose repeatability for the ion implantation.

10. The method according to claim 8, further comprising performing the ion implantation of the substrate within the end station if the predicted dose repeatability is less than the target dose repeatability for the ion implantation.

11. A method for controlling an ion implantation of a substrate according to predicted dose repeatability, comprising:
    tuning an ion source to generate a tuned ion beam suitable for performing the ion implantation of the substrate;
    obtaining beam current measurements from the tuned ion beam;
    determining the predicted dose repeatability for the ion implantation as a function of a standard deviation, an average, and a sample size of the beam current measurements; and
    controlling the ion implantation of the substrate as a function of the predicted dose repeatability.

12. The method according to claim 11, wherein the obtaining beam current measurements includes taking measurements along the beamline and an end station configured to receive the substrate during the ion implantation.

13. The method according to claim 11, wherein the tuning of the ion source comprises adjusting beamline element settings to generate an ion beam with desired beam properties.

14. The method according to claim 13, wherein the desired beam properties include noise and beam current.

15. The method according to claim 11, wherein the controlling of the ion implantation comprises retuning the ion source to attain a predicted dose repeatability that conforms to a target dose repeatability for the ion implantation.

16. A system for predicting dose repeatability for an ion implantation of a substrate, comprising:
    a tuner configured to tune an ion source to generate an ion beam suitable for performing the ion implantation of the substrate;
    a beamline monitor configured to obtain beam current measurements from the tuned ion beam; and
    a controller configured to predict the dose repeatability for the ion implantation as a function of a standard deviation, an average, and a sample size of the beam current measurements obtained by the beamline monitor.

17. The system according to claim 16, wherein the controller is configured to determine whether the predicted dose repeatability is in conformance with a target dose repeatability for the ion implantation.

18. The system according to claim 17, wherein the controller is configured to direct the ion beam from the ion source into an end station configured to receive the substrate during the ion implantation if the predicted dose repeatability is in conformance with the target dose repeatability.

19. The system according to claim 18, further comprising an end station monitor configured to obtain beam current measurements from the end station.

20. The system according to claim 19, wherein the controller is configured to predict the dose repeatability for the ion implantation as a function of the beam current measurements obtained from the end station by the end station monitor.

21. The system according to claim 20, wherein the tuner is configured to retune the ion source to generate an ion beam with desired beam noise and/or beam current if the predicted dose repeatability deviates from a target dose repeatability for the ion implantation.

22. An ion implanter, comprising:
    an ion source configured to generate an ion beam;
    a magnet configured to bend the path of the ion beam;

an end station configured to receive the ion beam from the magnet for ion implantation of a substrate within the end station; and a controller configured to control the ion implantation of the substrate as a function of predicted dose repeatability, wherein the controller predicts dose repeatability from at least a standard deviation, an average, and a sample size of beam current measurements obtained from the ion beam after tuning of the ion source.

23. A computer-readable medium storing computer instructions, which when executed by a computer system enables an ion implanter to control an ion implantation of a substrate according to predicted dose repeatability, the computer instructions comprising:

tuning an ion source to generate an ion beam suitable for performing the ion implantation of the substrate;

obtaining beam current measurements from the ion beam;

predicting the dose repeatability for the ion implantation as a function of a standard deviation, an average, and a sample size of the beam current measurements; and controlling the ion implantation of the substrate as a function of the predicted dose repeatability.

24. The computer-readable medium according to claim 23, wherein the obtaining beam current measurements includes instructions for taking measurements along the beamline and an end station configured to receive the substrate for the ion implantation.

25. The computer-readable medium according to claim 23, wherein the controlling of the ion implantation comprises instructions for retuning the ion source to attain a predicted dose repeatability that conforms to a target dose repeatability for the ion implantation.

* * * * *